US012787897B2

(12) United States Patent
Nakamura et al.

(10) Patent No.: US 12,787,897 B2
(45) Date of Patent: Nov. 3, 2026

(54) TERMINAL STRUCTURE AND WIRING SUBSTRATE

(71) Applicant: SHINKO ELECTRIC INDUSTRIES CO., LTD., Nagano (JP)

(72) Inventors: Junichi Nakamura, Nagano (JP); Tomoya Kitamura, Nagano (JP); Yoko Nakabayashi, Nagano (JP)

(73) Assignee: SHINKO ELECTRIC INDUSTRIES, CO., LTD., Nagano (JP)

( * ) Notice: Subject to any disclaimer, the term of this patent is extended or adjusted under 35 U.S.C. 154(b) by 196 days.

(21) Appl. No.: 18/679,656

(22) Filed: May 31, 2024

(65) Prior Publication Data

US 2024/0413063 A1 Dec. 12, 2024

(30) Foreign Application Priority Data

Jun. 6, 2023 (JP) ................................ 2023-093056

(51) Int. Cl.
*H10W 90/00* (2026.01)
*H05K 1/02* (2006.01)
*H05K 1/11* (2006.01)

(52) U.S. Cl.
CPC ........ *H10W 90/701* (2026.01); *H05K 1/0298* (2013.01); *H05K 1/115* (2013.01); *H05K 2201/10984* (2013.01); *H10W 90/724* (2026.01)

(58) Field of Classification Search
CPC ............ H10W 90/701; H10W 90/724; H10W 72/072; H10W 72/20; H05K 1/0298; H05K 1/115; H05K 2201/10984
See application file for complete search history.

(56) References Cited

U.S. PATENT DOCUMENTS

| | | | | |
|---|---|---|---|---|
| 2020/0315013 | A1* | 10/2020 | Nakamura | H05K 3/4652 |
| 2021/0090902 | A1* | 3/2021 | Cho | H10W 70/093 |
| 2021/0136914 | A1 | 5/2021 | Kawai | |
| 2022/0399297 | A1* | 12/2022 | Nakabayashi | H10W 90/701 |

FOREIGN PATENT DOCUMENTS

| | | | |
|---|---|---|---|
| JP | 2014192363 A | * | 10/2014 |
| JP | 2021072339 A | | 5/2021 |
| JP | 2022189275 A | | 12/2022 |

OTHER PUBLICATIONS

JP2014192363A English translation (Year: 2014).*

* cited by examiner

*Primary Examiner* — Timothy J Thompson
*Assistant Examiner* — Aditya Sharma
(74) *Attorney, Agent, or Firm* — Renner, Otto, Boisselle & Sklar, LLP; Christopher Harris

(57) ABSTRACT

A terminal structure includes a first wiring layer, an insulation layer covering the first wiring layer, an opening extending through the insulation layer, via wiring formed in the opening, a second wiring layer electrically connected to the via wiring on the insulation layer, a protective metal layer formed on the second wiring layer, a solder layer formed on the protective metal layer, and an intermetallic compound layer formed between the protective metal layer and the solder layer. The protective metal layer includes a projection projecting further outward from a side surface of the second wiring layer. The intermetallic compound layer covers only the upper surface of the protective metal layer. The solder layer covers only an upper surface of the intermetallic compound layer and exposes the side surfaces of the intermetallic compound layer, the protective metal layer, and the second wiring layer.

14 Claims, 14 Drawing Sheets

TERMINAL STRUCTURE AND WIRING SUBSTRATE

CROSS-REFERENCE TO RELATED APPLICATIONS

This application is based upon and claims the benefit of priority from prior Japanese Patent Application No. 2023-093056, filed on Jun. 6, 2023, the entire contents of which are incorporated herein by reference.

FIELD

This disclosure relates to a terminal structure, a wiring substrate, and a method for manufacturing a terminal structure.

BACKGROUND

Wiring substrates for mounting electronic components, such as semiconductor elements, are available in various shapes and structures. Japanese Laid-Open Patent Publication No. 2022-189275 describes a wiring substrate including a solder layer that covers the upper surface and side surfaces of a protective metal layer formed on connection pads.

In a conventional wiring substrate, solder layers have a tendency to sag during a reflow process. This may cause short circuiting between adjacent solder layers.

SUMMARY

This Summary is provided to introduce a selection of concepts in a simplified form that are further described below in the Description of the Embodiments. This Summary is not intended to identify key features or essential features of the claimed subject matter, nor is it intended to be used as an aid in determining the scope of the claimed subject matter.

In one general aspect, a terminal structure includes a first wiring layer, an insulation layer covering the first wiring layer, an opening extending through the insulation layer in a thickness-wise direction and partially exposing an upper surface of the first wiring layer, via wiring formed in the opening, a second wiring layer electrically connected to the via wiring and formed on an upper surface of the insulation layer, a protective metal layer formed on an upper surface of the second wiring layer, a solder layer formed on an upper surface of the protective metal layer, and an intermetallic compound layer formed at an interface between the protective metal layer and the solder layer. The protective metal layer includes a projection projecting further outward from a side surface of the second wiring layer. The intermetallic compound layer covers only the upper surface of the protective metal layer and exposes a side surface of the protective metal layer and the side surface of the second wiring layer. The solder layer covers only an upper surface of the intermetallic compound layer and exposes a side surface of the intermetallic compound layer, the side surface of the protective metal layer, and the side surface of the second wiring layer.

Other features and aspects will be apparent from the following detailed description, the drawings, and the claims.

BRIEF DESCRIPTION OF THE DRAWINGS

The embodiments, together with objects and advantages thereof, may best be understood by reference to the following description of the presently preferred embodiments together with the accompanying drawings.

Throughout the drawings and the detailed description, the same reference numerals refer to the same elements. The drawings may not be to scale, and the relative size, proportions, and depiction of elements in the drawings may be exaggerated for clarity, illustration, and convenience.

DESCRIPTION OF THE EMBODIMENTS

Figure 1:
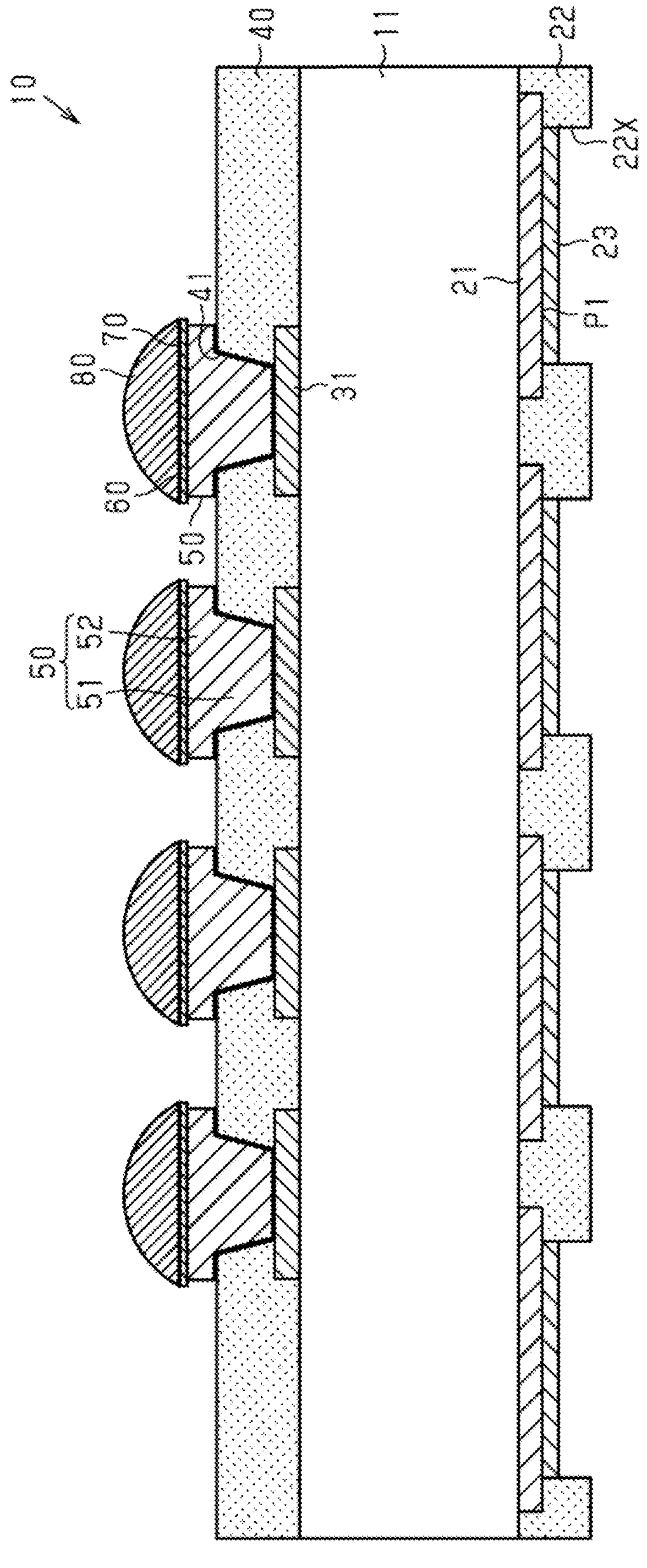
FIG. 1 is a schematic cross-sectional view illustrating one embodiment of a wiring substrate.

This description provides a comprehensive understanding of the methods, apparatuses, and/or systems described. Modifications and equivalents of the methods, apparatuses, and/or systems described are apparent to one of ordinary skill in the art. Sequences of operations are exemplary, and may be changed as apparent to one of ordinary skill in the art, with the exception of operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art.

In this specification, “at least one of A and B” should be understood to mean “only A, only B, or both A and B.”

One embodiment will now be described with reference to the drawings.

In the drawings, elements are illustrated for simplicity and clarity and have not necessarily been drawn to scale. To facilitate understanding, hatching lines may be replaced by shadings or not be illustrated in the cross-sectional views. In this specification, a plan view refers to a view of a subject taken in a vertical direction (e.g., vertical direction as viewed in FIG. 1), and a planar shape refers to a shape of a subject as viewed in the vertical direction. Further, in this specification, upward, downward, leftward, and rightward directions refer to directions that allow for the reference characters denoting members to be read properly. Also, in this specification, the terms of parallel, orthogonal, and horizontal are not meant to be strictly parallel, orthogonal, and horizontal and include generally parallel, orthogonal, and horizontal states in a range allowing the advantages of the present embodiment to be obtained.

Overall Structure of Wiring Substrate 10

As illustrated in FIG. 1, a wiring substrate 10 includes a substrate body 11. A wiring layer 21 and a solder resist layer 22 are stacked in order on the lower surface of the main substrate body 11. A wiring layer 31, an insulation layer 40, connection terminals 50, a protective metal layer 60, an intermetallic compound layer 70, and a solder layer 80 are stacked in order on the upper surface of the substrate body 11.

A wiring structure of alternately stacked insulative resin layers and wiring layers may be used as the substrate body 11. The wiring structure, for example, may include a core substrate but does not have to include a core substrate. The material of the insulative resin layers may be, for example, an insulative thermosetting resin. The insulative thermosetting resin may be, for example, an insulative resin such as an epoxy resin, a polyimide resin, or a cyanate resin. The material of the insulative resin layers may also be, for example, an insulative resin of which the main component is a photosensitive resin such as a phenolic resin or a polyimide resin. The insulative resin layers may include, for example, a filler of silica or alumina.

The material of the wiring layers for the substrate body 11 and the wiring layers 21 and 31 may be, for example, copper (Cu) or a copper alloy. The material of the solder resist layer 22 may be, for example, an insulative resin of which the main component is a photosensitive resin such as a phenolic resin or a polyimide resin. The solder resist layer 22 may include, for example, a filler of silica or alumina.

The wiring layer 21 is formed on the lower surface of the substrate body 11. The wiring layer 21 is the outermost wiring layer (here, lowermost wiring layer) of the wiring substrate 10.

The solder resist layer 22 is formed on the lower surface of the main substrate body 11 so as to cover the wiring layer 21. The solder resist layer 22 is the outermost insulation layer (here, lowermost insulation layer) of the wiring substrate 10.

The solder resist layer 22 includes openings 22X exposing parts of the lower surface of the wiring layer 21 as external connection pads P1. The external connection pads P1 are connected to external connection terminals 96 (refer to FIG. 3) when mounting the wiring substrate 10 on a mounting board such as a motherboard.

A surface-processed layer 23 is formed on the lower surface of the wiring layer 21 exposed at the bottom of each opening 22X. Examples of the surface-processed layer 23 include a gold (Au) layer, a nickel (Ni) layer/Au layer (metal layer in which a Ni layer is a bottom layer, and a Au layer is stacked on the Ni layer), a Ni layer/palladium (Pd) layer/Au layer (metal layer in which a Ni layer is a bottom layer, and the Ni layer and a Pd layer are stacked in this order on a Au layer). Further examples of the surface-processed layer 23 include a Ni layer/Pd layer (metal layer in which a Ni layer is a bottom layer, and a Pd layer is formed on the Ni layer) and a Pd layer/Au layer (metal layer in which a Pd layer is a bottom layer, and a Au layer is formed on the Pd layer). A Au layer is a metal layer formed from Au or a Au alloy, a Ni layer is a metal layer formed from Ni or a Ni alloy, and a Pd layer is a metal layer formed from Pd or a Pd alloy. A Au layer, a Ni layer, and a Pd layer may each be, for example, a metal layer formed through an electroless plating process (electroless plating layer) or a metal layer formed through an electrolytic plating process (electrolytic plating layer). Further, the surface-processed layer 23 may be an organic solderability preservative (OSP) film formed by performing an anti-oxidation process on the lower surface of the wiring layer 21 exposed from the openings 22X. The OSP film may be, for example, an organic coating of an azole compound or an imidazole compound. When the surface-processed layer 23 is formed on the lower surface of the wiring layer 21, the surface-processed layer 23 has the functionality of the external connection pads P1.

In the present example, the external connection terminals 96 (refer to FIG. 3) are arranged on the surface-processed layer 23. Instead, external connection terminals may be defined by the wiring layer 21 exposed from the openings 22X or by the surface-processed layer 23 if the surface-processed layer 23 is formed on the wiring layer 21.

The wiring layer 31 is formed on the upper surface of the main substrate body 11. The wiring layer 31 is electrically connected to the wiring layer 21 through, for example, wiring layers and through-electrodes in the substrate body 11.

The insulation layer 40 is stacked on the substrate body 11 partially covering the wiring layer 31. The insulation layer 40 is the outermost insulation layer (here, uppermost insulation layer) of the wiring substrate 10. The insulation layer 40 may be formed from the same material as the insulative resin layers of the main substrate body 11. Further, the insulation layer 40 may be a solder resist layer. The solder resist layer may be formed from, for example, the same material as the solder resist layer 22. The insulation layer 40 has a thickness from the upper surface of the wiring layer 31 to the upper surface of the insulation layer 40 of, for example, approximately 4 μm to 30 μm.

The insulation layer 40 includes openings 41 extending through the insulation layer 40 in the thickness-wise direction and partially exposing the upper surface of the wiring layer 31. The openings 41 may have any shape and size in plan view. In the present example, the openings 41 are circular in plan view. The openings 41 each have a depth of, for example, approximately 4 μm to 30 μm. The openings 41 of the present example are each tapered so that the opening width (opening diameter) increases from the lower side (side closer to substrate body 11) toward the upper side as viewed in FIG. 1.

The openings 41 each have a wall surface that is, for example, inclined so that the center of the opening 41 in plan view becomes closer from the upper surface of the insulation layer 40 toward the wiring layer 31. The wall surface of the opening 41 does not have to be straight and may be partially or entirely convex or concave.

Structure of Connection Terminal 50

Figure 2:
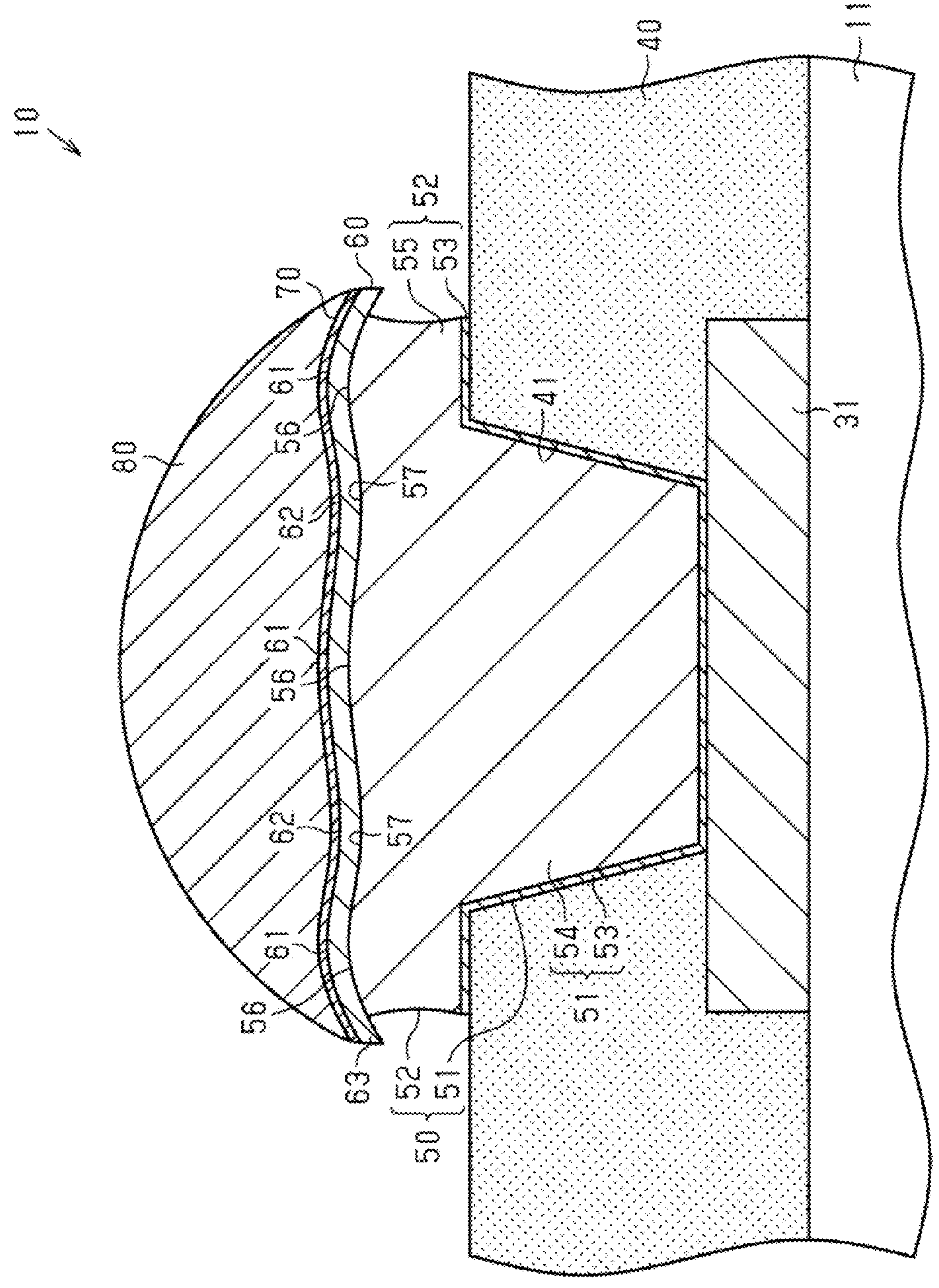
FIG. 2 is a partially enlarged cross-sectional view of the wiring substrate illustrated in FIG. 1.

Referring to FIG. 2, the connection terminals 50 are formed on parts of the wiring layer 31 exposed by the openings 41. The connection terminals 50 function as, for example, electronic component mounting pads electrically connected to an electronic component. The connection terminals 50 each include, for example, a via wiring 51 that is formed in the corresponding opening 41 and a wiring layer 52 that is electrically connected to the wiring layer 31 by the via wiring 51 and formed on the upper surface of the insulation layer 40. The connection terminals 50 may have any shape and size in plan view. In the present example, the connection terminals 50 are circular in plan view.

Each opening 41 is, for example, filled with the corresponding via wiring 51. The via wiring 51 is shaped in conformance with the opening 41. The wiring layer 52 has, for example, the form of a post extending upward from the upper surface of the insulation layer 40.

The connection terminal 50 includes a seed layer 53 that covers the wall surface of each opening 41 and the upper surface of the insulation layer 40. The seed layer 53 of the present example continuously covers the upper surface of the insulation layer 40, the entire wall surface of each opening 41, and the entire upper surface of the wiring layer 31 that is exposed at the bottom of the opening 41. The material of the seed layer 53 may be, for example, copper or a copper alloy. The seed layer 53 may be, for example, an electroless plating metal layer formed through an electroless plating process.

The connection terminals 50 include a metal layer 54 formed on the seed layer 53. The openings 41 are filled with the metal layer 54. The material of the metal layer 54 may be copper or a copper alloy. The metal layer 54 may be, for example, an electrolytic plating layer formed through an electrolytic plating process.

The seed layer 53 and the metal layer 54 in each opening 41 form the via wiring 51 of the corresponding connection terminal 50.

Each connection terminal 50 includes a metal post 55 that is formed on the seed layer 53, which is formed on the insulation layer 40, and the via wiring 51 (metal layer 54). The metal post 55 projects upward from the upper surface of the insulation layer 40. The metal post 55 is, for example, formed integrally with the metal layer 54. The metal post 55 may have any shape and size in plan view. For example, the metal post 55 may be circular in plan view and have a diameter of approximately 15 μm to 40 μm. The metal post 55 may have a thickness of, for example, approximately 2 μm to 50 μm.

The material of the metal post 55 may be, for example, copper or a copper alloy. The metal post 55 may be, for example, an electrolytic plating layer formed through an electrolytic plating process.

The upper surface of the metal post 55 is, for example, wavy in the thickness direction of the metal post 55. The upper surface of the metal post 55 is for example, undulated and extends up and down. In the present example, the upper surface of the metal post 55 is an undulated surface including protruded portions 56 and recessed portions 57 that are arranged repetitively. Each of the protruded portions 56 is protruded toward the protective metal layer 60 with an arcuate cross section, and each of the recessed portions 57 is recessed toward the wiring layer 31 with an arcuate cross section. In the present embodiment, the metal post 55 includes three protruded portions 56 and two recessed portions 57. The upper surface of the metal post 55 is undulated and includes the protruded portions 56 and the recessed portions 57 arranged alternately one after another in a planar direction (lateral direction in FIG. 2), which is orthogonal to the thickness-wise direction of the metal post 55.

Each protruded portion 56 has, for example, an arcuate and curved surface. The protruded portions 56 may have the same radius of curvature or may have different radii of curvature. Each recessed portion 57 has, for example, an arcuate and curved surface. The recessed portions 57 may have the same radius of curvature or may have different radii of curvature. The radius of curvature of the recessed portions 57 may be the same as the protruded portions 56 or differ from the protruded portions 56.

The metal post 55 includes a side surface that is, for example, arcuate and curved. The side surface of the metal post 55 is recessed into the metal post 55 with an arcuate cross section. For example, the metal post 55 has an outer diameter that is the smallest at a middle part in the thickness-wise direction of the metal post 55.

The metal posts 55 and the seed layer 53, which is formed on the insulation layer 40, forms the wiring layer 52 of the connection terminals 50.

Structure of Protective Metal Layer 60

The protective metal layer 60 is formed on the upper surface of the wiring layer 52, that is, the upper surface of the metal post 55. The protective metal layer 60 covers only the upper surface of the wiring layer 52. The protective metal layer 60 covers the entire upper surface of the wiring layer 52. The side surfaces of the wiring layer 52 are exposed from the protective metal layer 60. The side surface of each metal post 55 and the side surface of the seed layer 53 are entirely exposed from the protective metal layer 60.

The protective metal layer 60, for example, limits diffusion and oxidation of the metal forming the connection terminals 50 (copper, in this case). The protective metal layer 60 may be a Ni layer, a Au layer, a Ni layer/Au layer, a Ni layer/Pd layer/Au layer, a Ni layer/Pd layer, a Pd layer/Au layer, or the like. In the present example, the protective metal layer 60 is a Ni layer. The protective metal layer 60 may have a thickness of, for example, approximately 0.01 μm to 3 μm.

The protective metal layer 60 may have any shape and any size in plan view. The protective metal layer 60 may be, for example, circular and shaped in conformance with each connection terminal 50. The protective metal layer 60 is larger in size in plan view than the connection terminal 50. The protective metal layer 60 is slightly larger in size in plan view than the connection terminal 50. For example, the protective metal layer 60 may be circular and have a diameter of approximately 20 μm to 50 μm.

The protective metal layer 60 is, for example, shaped in conformance with the undulation of the metal post 55. In the present example, the protective metal layer 60 is an undulated surface including protruded portions 61 and recessed portions 62 that are arranged repetitively. Each of the protruded portions 61 is protruded toward the solder layer 80 with an arcuate cross section, and each of the recessed portions 62 is recessed toward the wiring layer 31 with an arcuate cross section. In the present embodiment, the upper surface of the protective metal layer 60 includes three protruded portions 61 and two recessed portions 62. Each protruded portion 61 has an arcuate and curved surface extending along the corresponding protruded portion 56. Each recessed portion 62 has an arcuate and curved surface extending along the corresponding recessed portion 57.

The protective metal layer 60 includes a projection 63 projecting further outward from the side surface of the wiring layer 52. The projection 63 projects outward in the planar direction (lateral direction in FIG. 2) from the side surface of the wiring layer 52 in plan view. The projection 63 includes the outer circumferential edge of the protective metal layer 60. The projection 63 extends continuously in the circumferential direction around the entire protective metal layer 60.

The projection 63 extends downward from the side surface of the wiring layer 52 toward a projection end of the projection 63. The projection 63 is, for example, separated from and faces the wiring layer 52 in the planar direction of the wiring layer 52. The projection 63, for example, overlaps the wiring layer 52 as viewed in the planar direction of the wiring layer 52 (i.e., horizontal direction). The projection 63 is, for example, continuous with the protruded portions 61 of the protective metal layer 60. The lower surface of the projection 63 has, for example, the same radius of curvature as the lower surface of each protruded portion 61. The lower surface of the projection 63 is curved to have, for example, the same radius of curvature as the upper surface of each protruded portion 56.

The lower surface of the projection 63, that is, the lower surface at the outer circumferential edge of the protective metal layer 60, is exposed from the wiring layer 52. The side surface of the protective metal layer 60, the lower surface of the projection 63, and the side surface of the wiring layer 52 form a step.

Structure of Intermetallic Compound Layer 70

The intermetallic compound layer 70 is formed at an interface (bonding interface) between the protective metal layer 60 and the solder layer 80. The intermetallic compound layer 70 is formed at an interface between the upper surface of the protective metal layer 60 and the lower surface of the solder layer 80. The intermetallic compound layer 70 is formed at a portion where the protective metal layer 60 and the solder layer 80 are bonded. In other words, the intermetallic compound layer 70 substantially bonds the protective metal layer 60 and the solder layer 80.

The intermetallic compound layer 70 covers only the upper surface of the protective metal layer 60. The intermetallic compound layer 70 covers the entire upper surface of the protective metal layer 60. The side surface of the protective metal layer 60 and the side surface of the wiring layer 52 are exposed from the intermetallic compound layer 70. The side surface of the protective metal layer 60 and the side surface of the wiring layer 52 are entirely exposed from the intermetallic compound layer 70. In other words, the intermetallic compound layer 70 is not formed on the side surface of the protective metal layer 60 and the side surface of the wiring layer 52.

The intermetallic compound layer 70 is, for example, undulated in conformance with the undulation of each metal post 55 and the undulation of the protective metal layer 60. In the present example, the intermetallic compound layer 70 is an undulated surface including protruded portions and recessed portions that are arranged repetitively. Each of the protruded portions is protruded toward the solder layer 80 with an arcuate cross section, and each of the recessed portions is recessed toward the wiring layer 31 with an arcuate cross section. Each protruded portion of the intermetallic compound layer 70 has an arcuate and curved surface extending along the corresponding protruded portion 61. Each recessed portion of the intermetallic compound layer 70 has an arcuate and curved surface extending along the corresponding recessed portion 62.

The intermetallic compound layer 70 is formed, for example, through the reaction between the metal (e.g., Ni) of the protective metal layer 60 and the metal (e.g., Sn) of the solder layer 80. The intermetallic compound layer 70 is formed, for example, through the reaction between the metal (e.g., Cu) of the metal post 55, the metal (e.g., Ni) of the protective metal layer 60, and the metal (e.g., Sn) of the solder layer 80. The intermetallic compound layer 70 is formed by, for example, the intermetallic compound of $(Cu,Ni)_6Sn_5$.

Structure of Solder Layer 80

The solder layer 80 is formed on the protective metal layer 60. The solder layer 80 is formed on the upper surface of the intermetallic compound layer 70. The solder layer 80 covers only the upper surface of the intermetallic compound layer 70. The solder layer 80 covers the entire upper surface of the intermetallic compound layer 70. The side surface of the intermetallic compound layer 70, the side surface of the protective metal layer 60, and the side surface of the wiring layer 52 are exposed from the solder layer 80. The entire side surface of the intermetallic compound layer 70, the entire side surface of the protective metal layer 60, and the entire side surface of the wiring layer 52 are exposed from the solder layer 80. In other words, the solder layer 80 is not formed on the side surface of the intermetallic compound layer 70, the side surface of the protective metal layer 60, and the side surface of the wiring layer 52.

The solder layer 80 has, for example, a spherical upper surface. The upper surface of the solder layer 80 is, for example, arcuate and curved. The curved upper surface of the solder layer 80 is, for example, convex. The upper surface of the solder layer 80 is, for example, curved so as to be bulged further upward as the center of the protective metal layer 60 in plan view becomes closer.

The material of the solder layer 80 may be eutectic solder or lead (Pb)-free solder. The lead-free solder may be tin (Sn)-silver (Ag) lead-free solder, Sn—Cu lead-free solder, Sn—Ag—Cu lead-free solder, or Sn-bismuth (Bi) lead-free solder.

The wiring layer 31, the insulation layer 40, the connection terminals 50, the protective metal layer 60, the intermetallic compound layer 70, and the solder layer 80 form a terminal structure of the wiring substrate 10.

Structure of Semiconductor Device 90

The structure of a semiconductor device 90 will now be described with reference to FIGS. 3 and 4.

Figure 3:
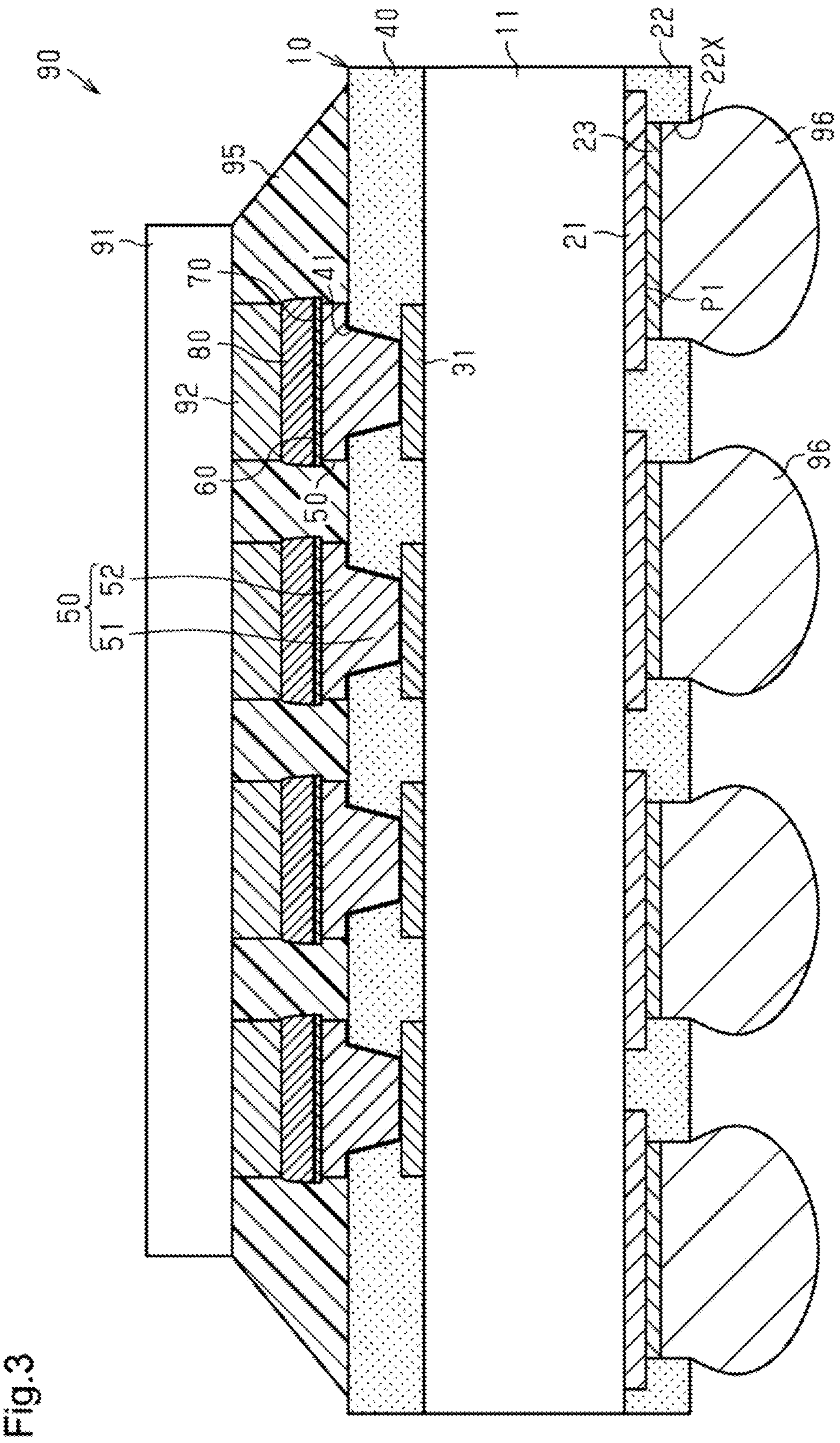
FIG. 3 is a schematic cross-sectional view of a semiconductor device including the wiring substrate of FIG. 1.

Referring to FIG. 3, the semiconductor device 90 includes the wiring substrate 10, one or more (one in this case) semiconductor elements 91, an underfill resin 95, and the external connection terminals 96.

Figure 4:
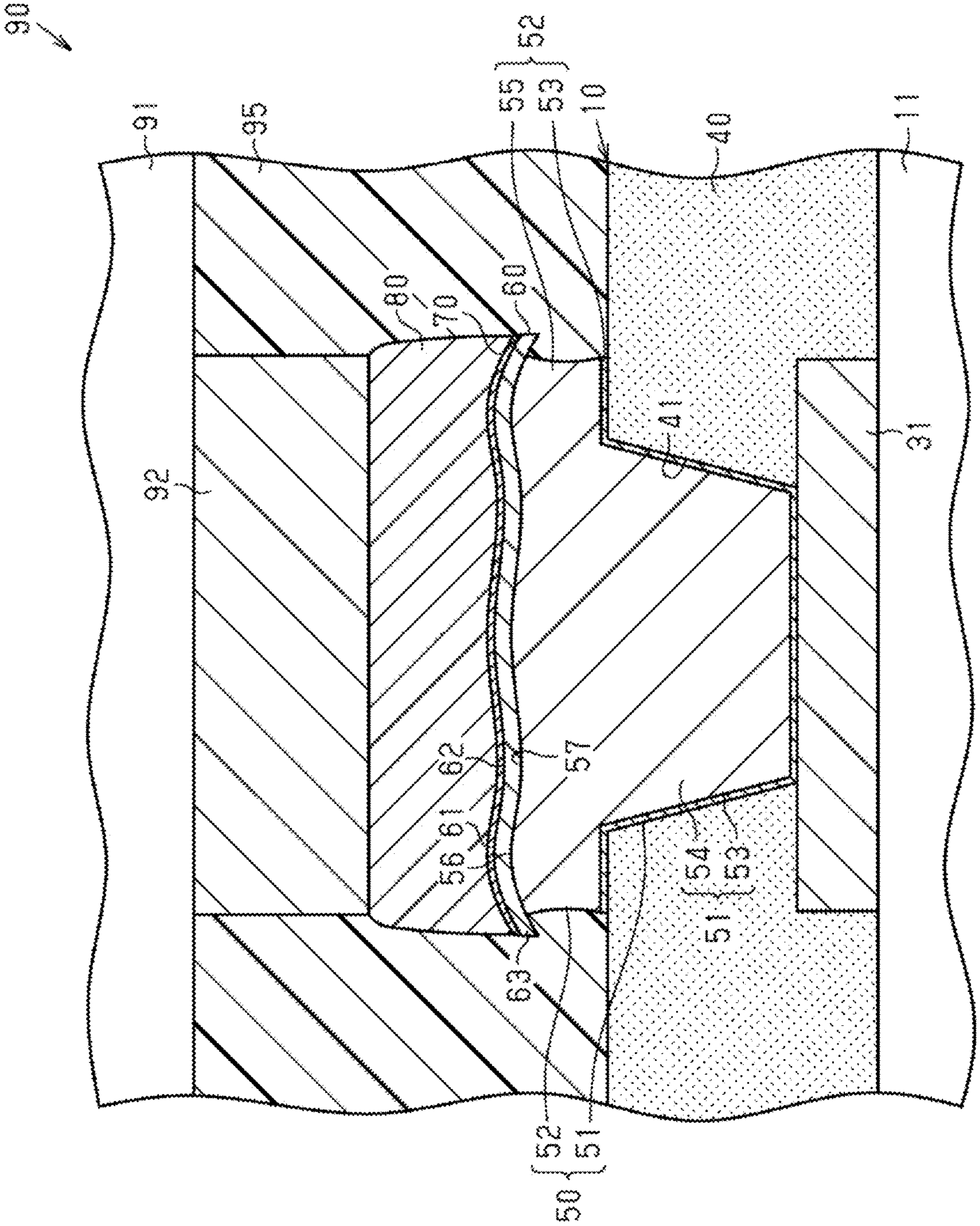
FIG. 4 is a partially enlarged cross-sectional view of the semiconductor device illustrated in FIG. 3.

Referring to FIGS. 3 and 4, the semiconductor element 91 includes connection terminals 92 formed on a circuit formation surface of the semiconductor element 91 (lower surface in this case). The semiconductor element 91 is flip-chip-mounted on the wiring substrate 10. The connection terminals 92 of the semiconductor element 91 are electrically connected to the terminal structure of the wiring substrate 10. Referring to FIG. 4, each connection terminal 92 of the semiconductor element 91 is electrically connected via the solder layer 80 to the protective metal layer 60 and the corresponding connection terminal 50. This electrically connects the semiconductor element 91 via the connection terminals 92, the solder layer 80, the intermetallic compound layer 70, and the protective metal layer 60 to the connection terminals 50. The solder layer 80 is bonded to the intermetallic compound layer 70 (protective metal layer 60) and the connection terminals 92.

The semiconductor element 91 may be, for example, a logic chip such as a central processing unit (CPU) chip or a graphics processing unit (GPU) chip. Further, the semiconductor element 91 may be, for example, a memory chip such as a dynamic random access memory (DRAM) chip, a static random access memory (SRAM), or a flash memory chip. Semiconductor elements 91 combining logic chips and memory chips may be mounted on the wiring substrate 10.

The connection terminals 92 may be, for example, metal posts. The connection terminals 92 are, for example, post-shaped and extend downward from the circuit formation surface of the semiconductor element 91. In the present example, the connection terminals 92 are, for example, cylindrical. The material of the connection terminals 92 may be, for example, copper or a copper alloy. In addition to metal posts, the connection terminals 92 may be metal bumps (e.g., gold bumps).

The gap between the wiring substrate 10 and the semiconductor element 91 is filled with the underfill resin 95. For example, the gap between the projections 63 of the protective metal layer 60 and the side surface of the wiring layer 52 are filled with the underfill resin 95. The material of the underfill resin 95 may be, for example, an insulative resin such as an epoxy resin.

Referring to FIG. 3, the external connection terminals 96 are formed on the external connection pads P1 of the wiring substrate 10. The external connection terminals 96 are, for example, connection terminals electrically connected to pads arranged on a mounting substrate such as a motherboard (not illustrated). The external connection terminals 96 may be, for example, solder balls or lead pins. In the present embodiment, solder balls are used as the external connection terminals 96.

In the present embodiment, the wiring layer 31 is one example of a first wiring layer, the wiring layer 52 is one example of a second wiring layer, each protruded portion 56 is one example of a first protruded portion, and each recessed portion 57 is one example of a first recessed portion.

Method for Manufacturing Wiring Substrate 10

A method for manufacturing the wiring substrate 10 will now be described with reference to FIGS. 5 to 12. A method for manufacturing the terminal structure of the wiring substrate 10 will be described in detail. To simplify illustration, elements that will consequently become final elements of the wiring substrate 10 are given the same reference characters as the final elements.

Figure 5:
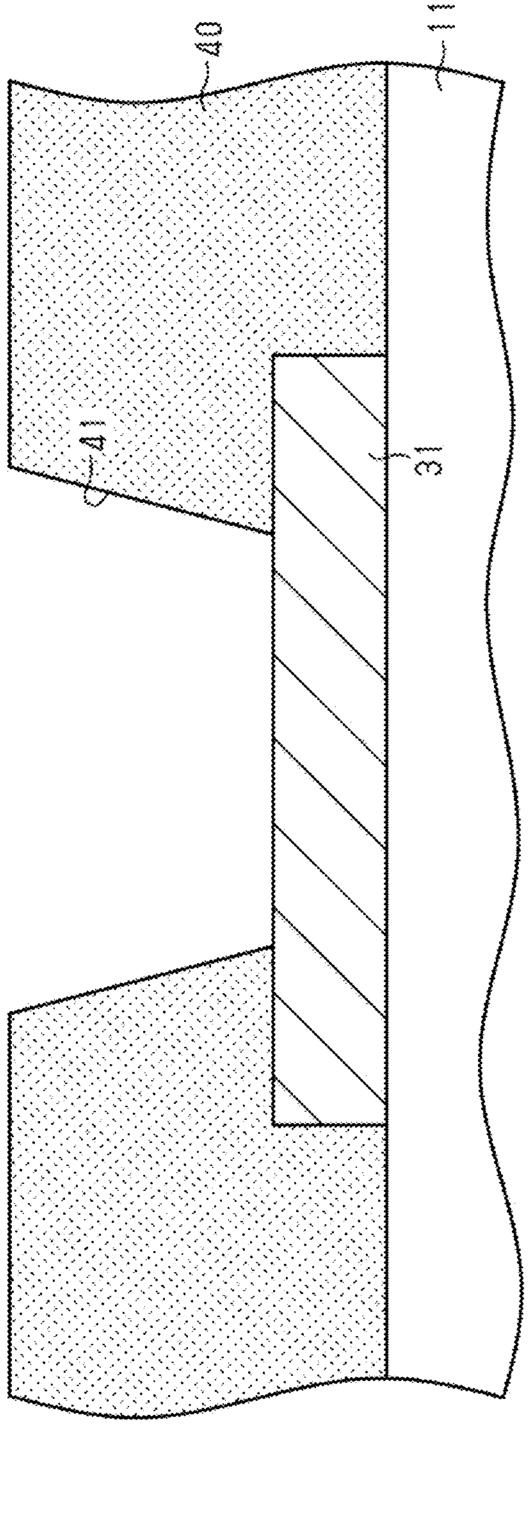
FIGS. 5, 6, 7, 8, 9, 10, 11, and 12 are schematic cross-sectional views illustrating a method for manufacturing the wiring substrate of FIG. 1.

As illustrated in FIG. 5, the wiring layer 31 and the insulation layer 40, which covers the wiring layer 31, are formed on the upper surface of the substrate body 11. Then, the openings 41 are formed extending through the insulation layer 40 in the thickness-wise direction. The method for manufacturing the structure of FIG. 5 is known in the art and thus will not be described in detail.

Figure 6:
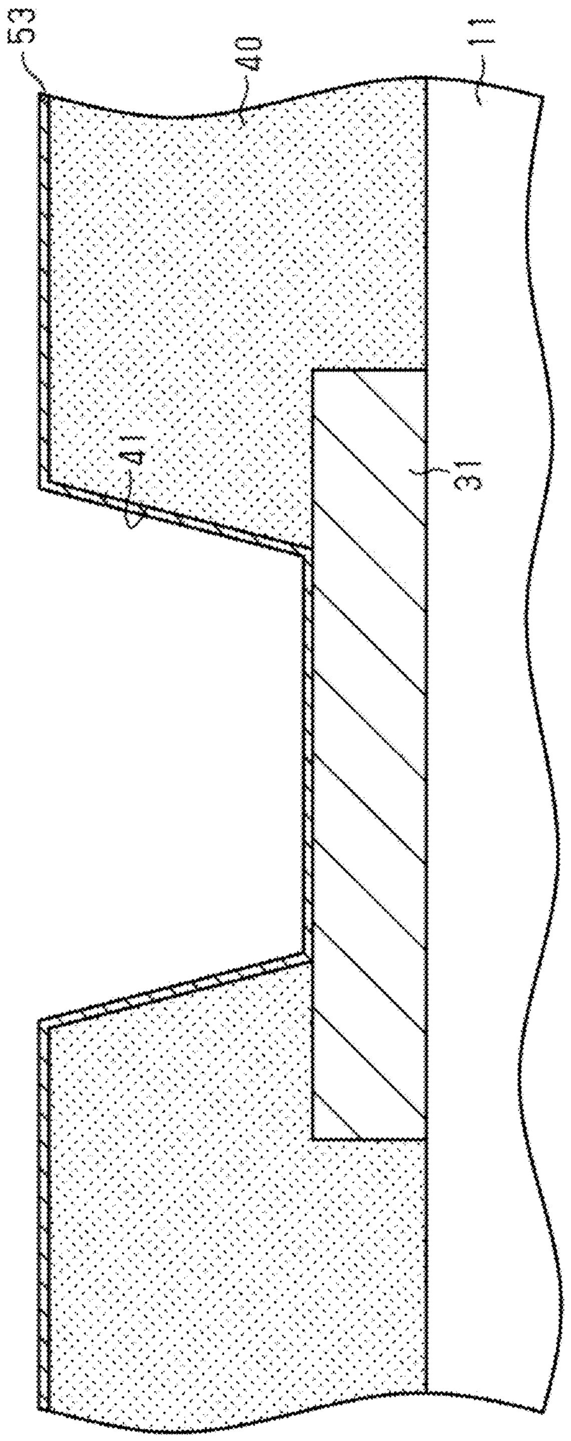

In the step of FIG. 6, the seed layer 53 is formed continuously covering the entire upper surface of the insulation layer 40 and the entire wall surface of each opening 41. The seed layer 53 is formed through, for example, an electroless plating process.

Figure 7:
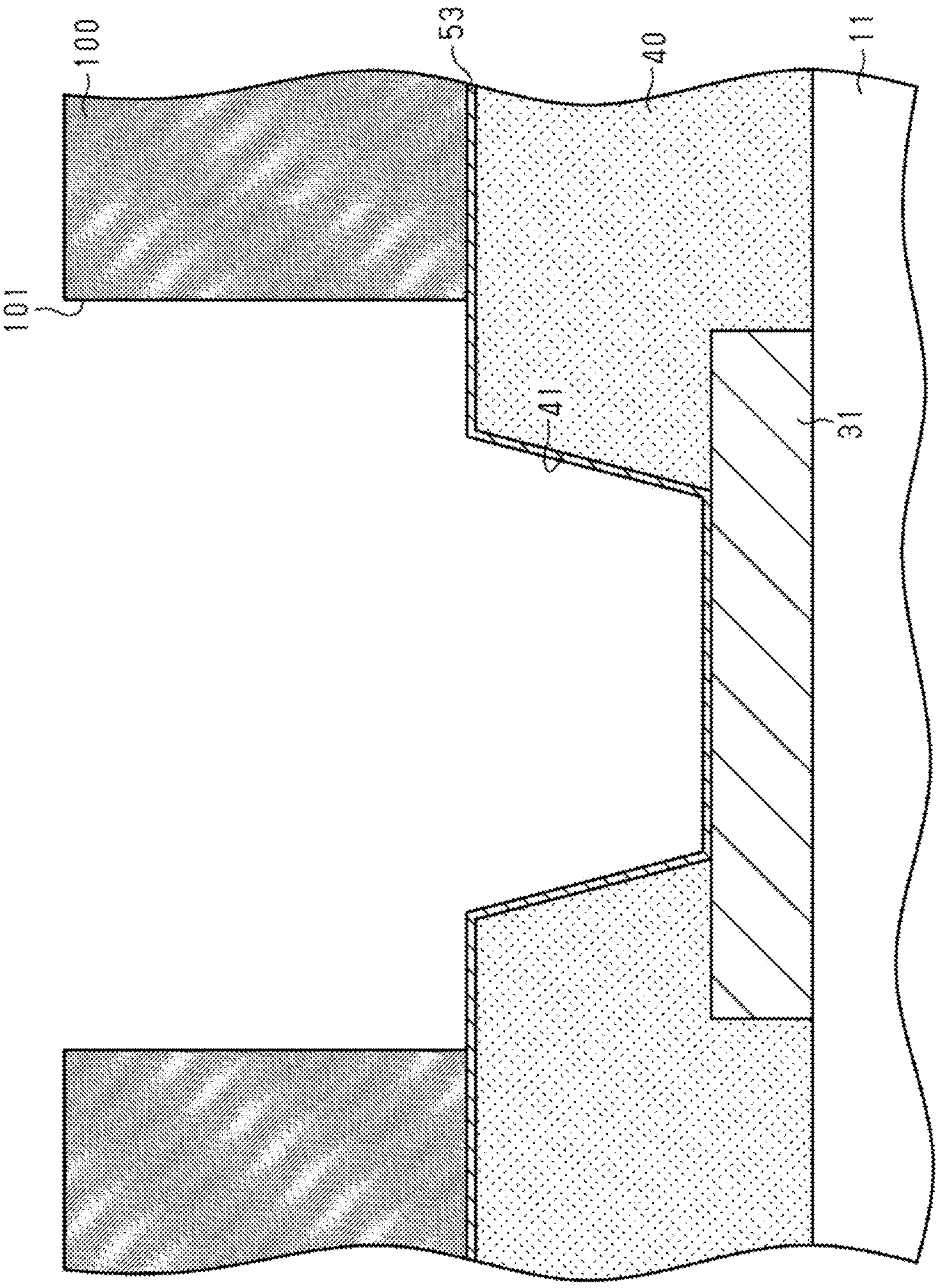

In the step of FIG. 7, a resist layer 100 including an opening pattern 101 is formed on the seed layer 53, which is formed on the upper surface of the insulation layer 40. The opening pattern 101 exposes the seed layer 53 at parts where the metal posts 55 (refer to FIG. 2) will be formed. The material of the resist layer 100 may be, for example, a material that resists plating in the electrolytic plating process performed in the following step. For example, a photosensitive dry film resist or a liquid photoresist may be used as the resist layer 100. Examples of the material of the resist layer 100 include a novolak resin, an acrylic resin, or the like. For example, when using a photosensitive dry film resist, thermal compression bonding is performed to laminate a dry film onto the upper surface of the seed layer 53, and a photolithography process is performed to pattern the dry film and form the resist layer 100 including the opening pattern 101. When using a liquid photoresist, the resist layer 100 may be performed through a similar process.

Figure 8:
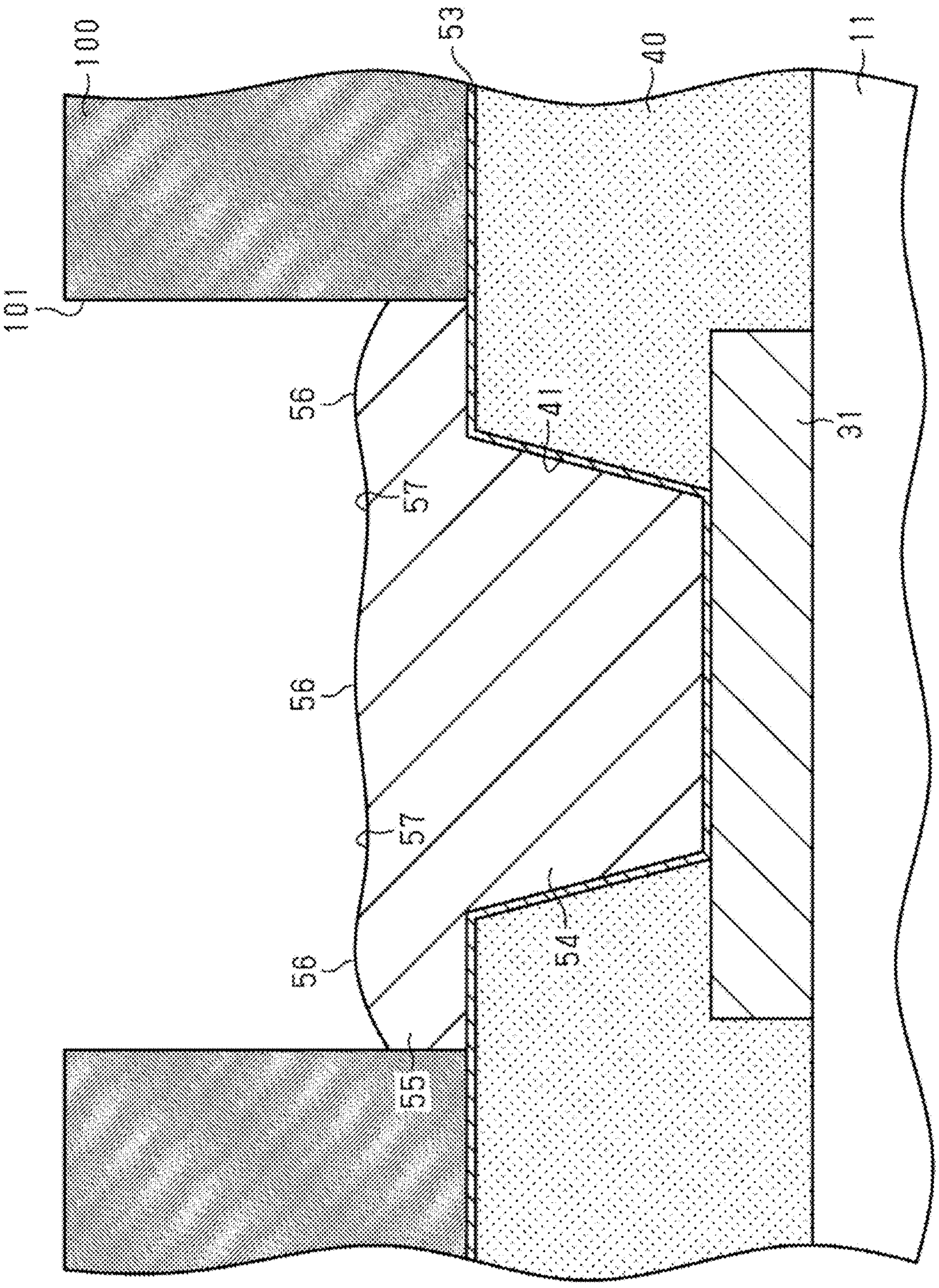

In the step of FIG. 8, electrolytic plating is performed on the seed layer 53 using the resist layer 100 as a plating mask and the seed layer 53 as a plating power feeding layer. In the present example, electrolytic plating (electrolytic copper plating) is performed on the upper surface of the seed layer 53 exposed by the opening pattern 101 of the resist layer 100. This forms the metal layer 54 on the seed layer 53 in the openings 41 and forms the metal posts 55 in the opening pattern 101. In this state, the upper surface of each metal post 55 is formed as an undulated surface including the protruded portions 56 and the recessed portions 57. In other words, in the present example, the plating conditions during the electrolytic plating process are adjusted so that the upper surface of each metal post 55 become undulated. For example, the composition of the plating bath and the electrodeposition conditions are adjusted so that the upper surface of each metal post 55 become undulated.

Figure 9:
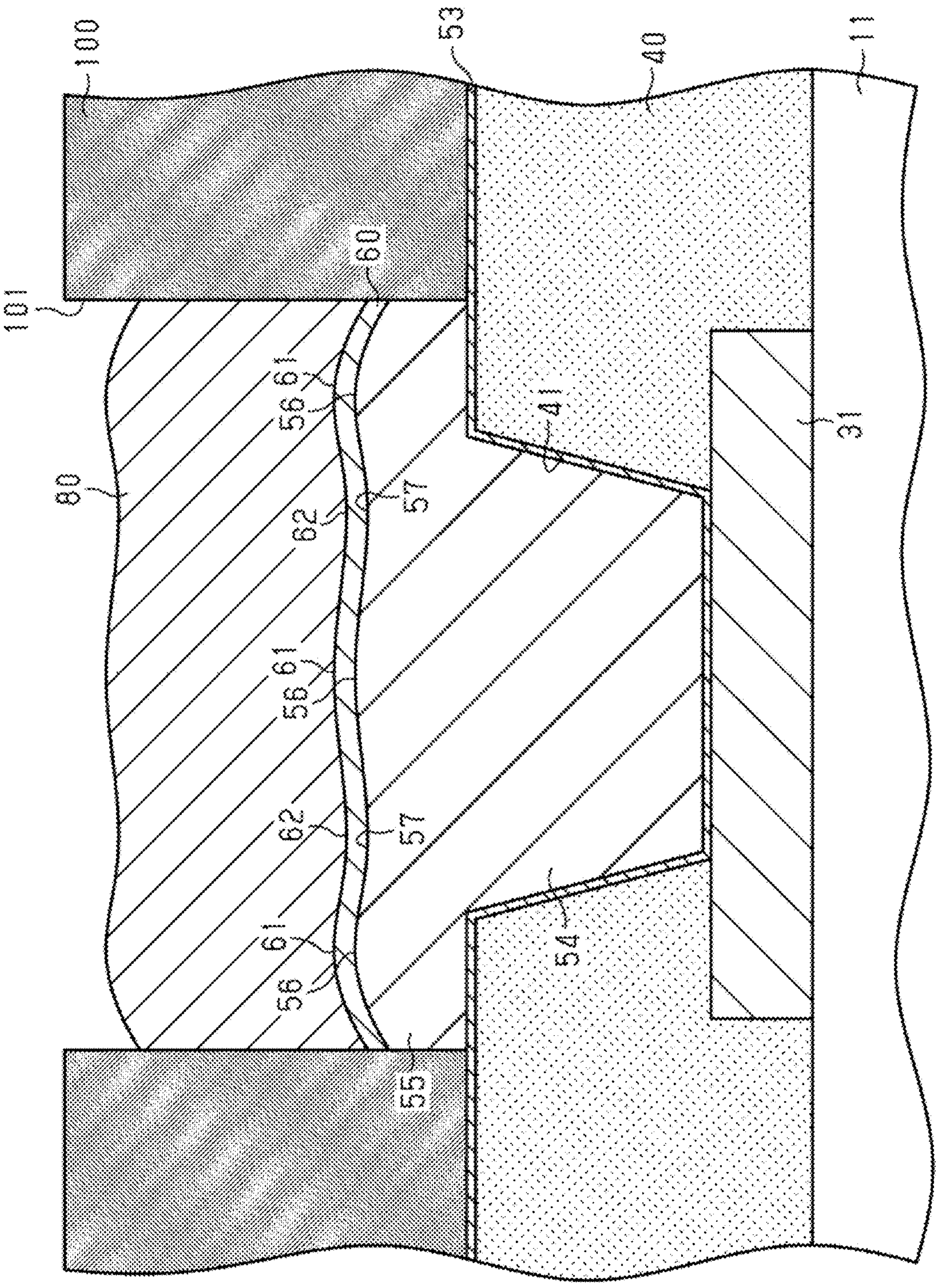

In the step of FIG. 9, electrolytic plating is performed on the metal posts 55 using the resist layer 100 as a plating mask and the seed layer 53 as a plating power feeding layer. For example, electrolytic plating (e.g., electrolytic Ni plating) is performed on the upper surface of each metal post 55 exposed by the opening pattern 101 of the resist layer 100 to form the protective metal layer 60 on the upper surface of the metal post 55. The protective metal layer 60 is formed on only the upper surface of the metal post 55. In this step, the side surface of the metal post 55 is covered by the resist layer 100. The protective metal layer 60 is not formed on the side surface of the metal post 55. Further, in this example, the protective metal layer 60 is shaped in conformance with the undulation of the upper surface of the metal post 55. Thus, the protective metal layer 60 is formed as an undulated surface including the protruded portions 61 and the recessed portions 62.

Then, electrolytic plating is performed on the protective metal layer 60 using the resist layer 100 as a plating mask and the seed layer 53 as a plating power feeding layer. For example, electrolytic tin plating is performed on the upper surface of the protective metal layer 60 exposed by the opening pattern 101 of the resist layer 100 to form the solder layer 80 on the upper surface of the protective metal layer 60. The solder layer 80 covers only the upper surface of the protective metal layer 60. In this step, the side surface of the protective metal layer 60 and the side surface of each metal post 55 is covered by the resist layer 100. Thus, the solder layer 80 is not formed on the side surface of the protective metal layer 60 and the side surface of the metal post 55. In this example, the upper surface of the solder layer 80 is shaped in conformance with the undulation of the protective metal layer 60.

Figure 10:
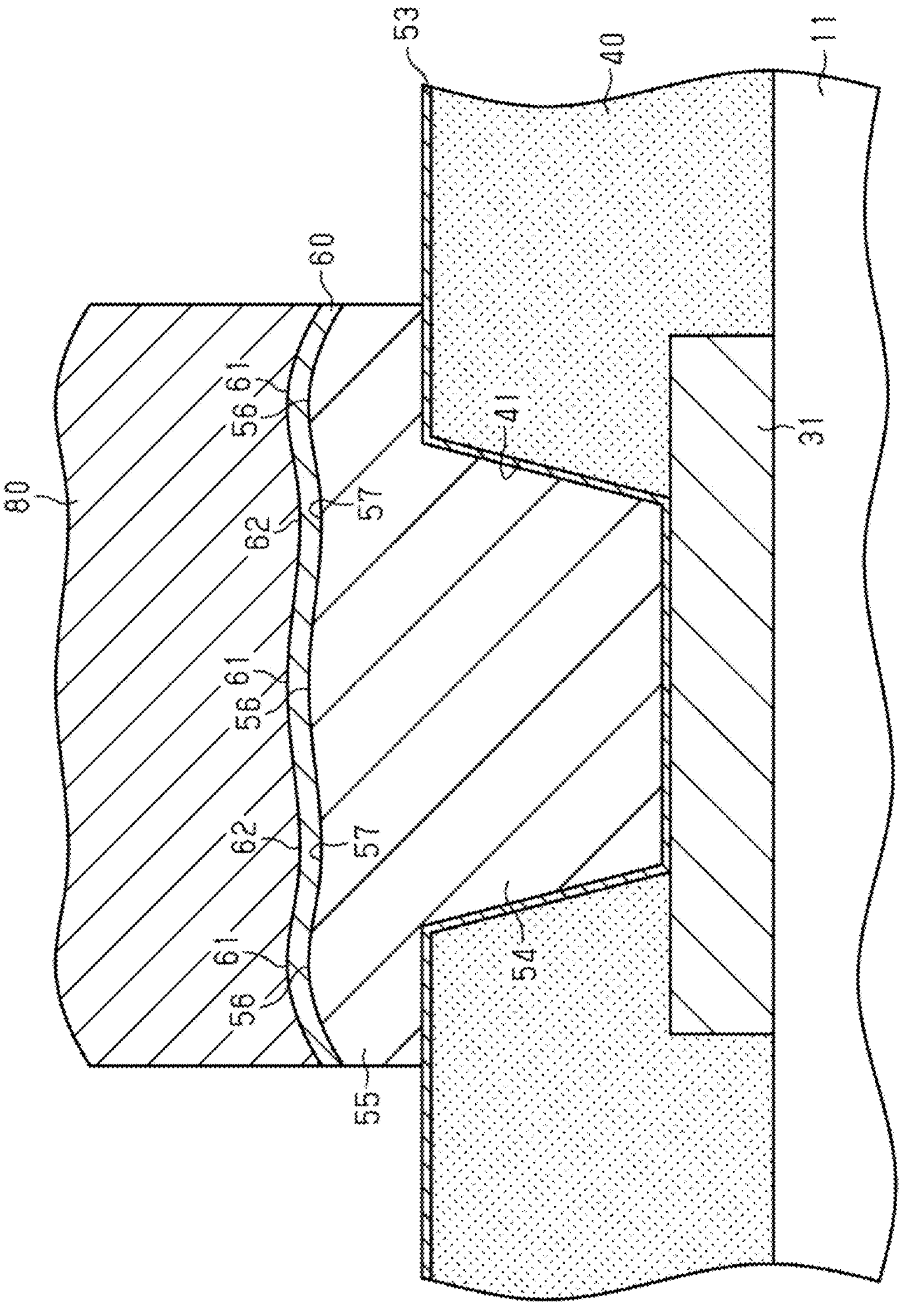

In the step of FIG. 10, the resist layer 100 illustrated in FIG. 9 is removed by an alkali delamination liquid (e.g., organic amine delamination liquid, caustic soda, or the like) or a delamination liquid of an organic solvent (e.g., acetone, ethanol, or the like). As a result, the side surface of each metal post 55, each side surface of the protective metal layer 60, each side surface of the solder layer 80, and the upper surface of the seed layer 53 are exposed to the outside.

Figure 11:
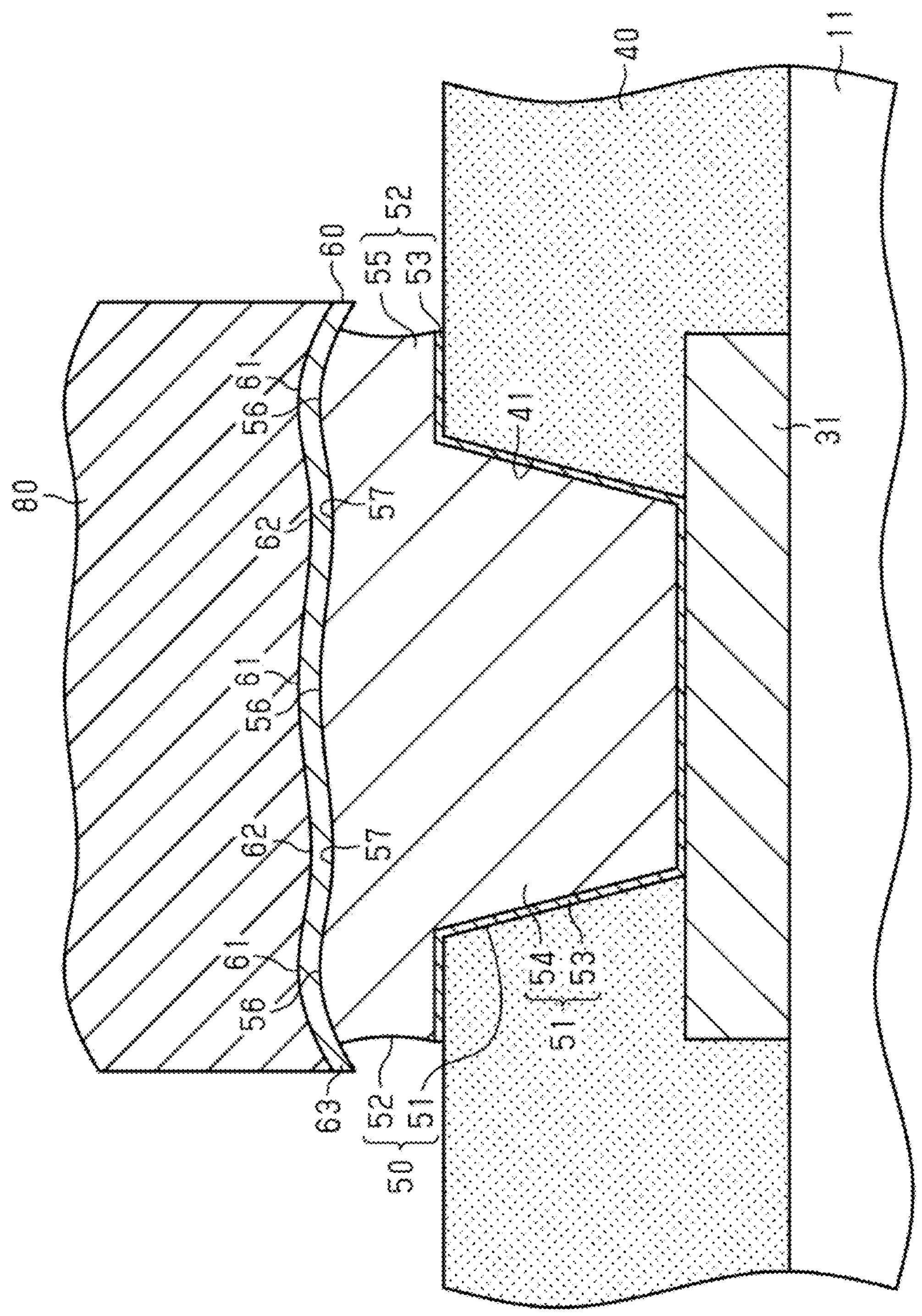

In the step of FIG. 11, etching is performed using the solder layer 80 and the protective metal layer 60 as an etching mask to remove unnecessary parts from the seed layer 53. For example, wet etching is performed to remove unnecessary parts of the seed layer 53. This forms the connection terminal 50 that includes the via wiring 51, which is formed in the opening 41 by the seed layer 53 and the metal layer 54, and the wiring layer 52, which is formed on the upper surface of the insulation layer 40 by the seed layer 53 and the metal post 55.

In the step of FIG. 11, the side surface of the metal post 55 is etched using the solder layer 80 and the protective metal layer 60 as an etching mask to reduce the metal post 55 in lateral size (widthwise dimension in horizontal direction). For example, isotropic etching (wet etching) is performed using the solder layer 80 and the protective metal layer 60 as an etching mask to reduce the lateral size of the metal post 55. Such isotropic etching produces a side etching effect in which etching advances in a planar direction of the metal post 55 thereby removing part of the metal post 55, which is covered by the protective metal layer 60, and reducing the lateral size of the metal post 55. This curves the side surface of the metal post 55 so that the side surface is inwardly recessed and arcuate. In this manner, the lateral size of the metal post 55 is reduced so that the side surface of the metal post 55 becomes curved. Consequently, the projection 63, which projects further outward from the side surface of the metal post 55, is formed at the outer circumferential edge of the protective metal layer 60. The metal post 55 may be reduced in lateral size, for example, at the same time as when unnecessary parts are removed from the seed layer 53.

Figure 12:
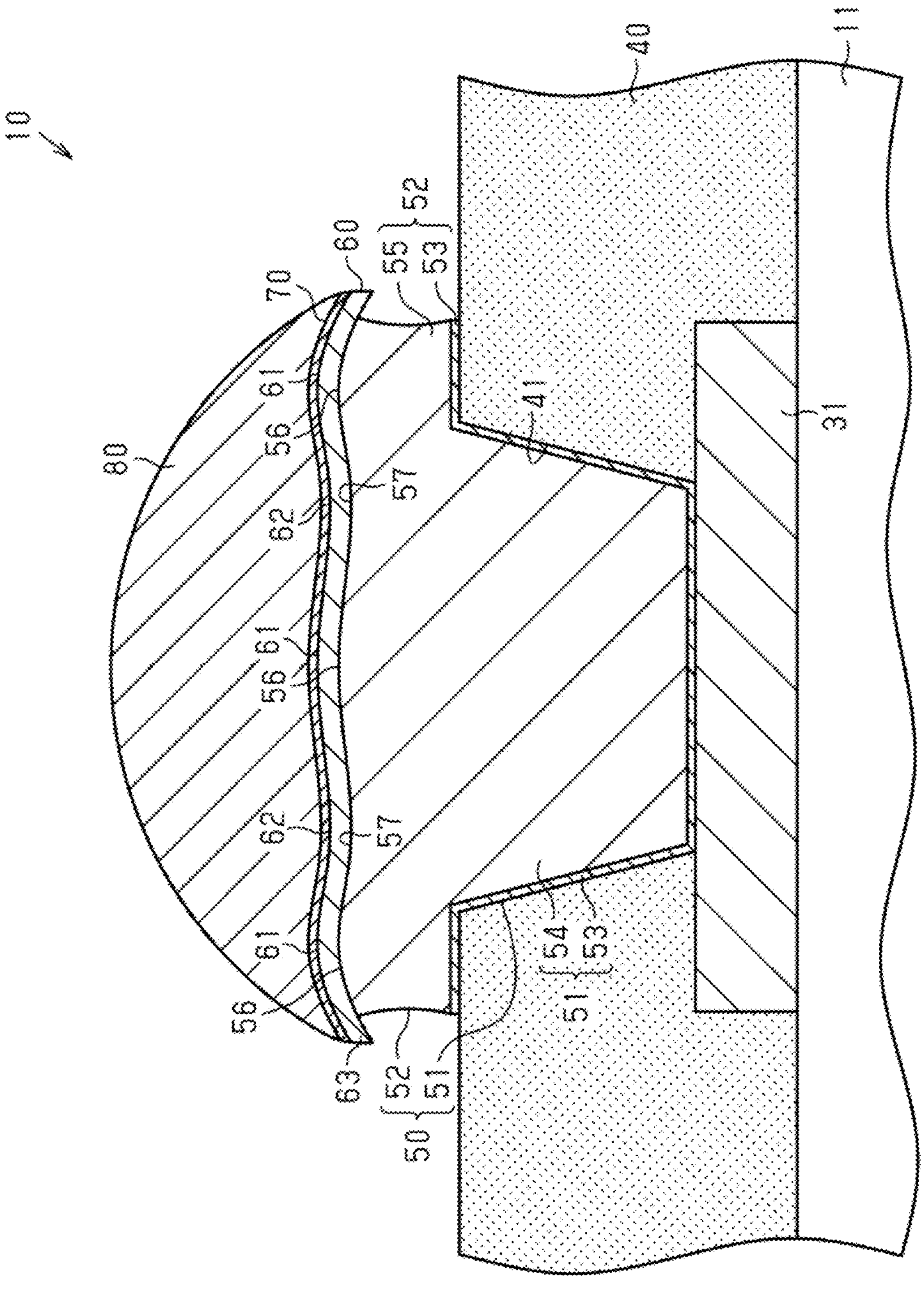

In the step of FIG. 12, a reflow process is performed to melt the solder layer 80 and form the spherical upper surface of the solder layer 80. The solder layer 80 is wet and spread on only the upper surface of the protective metal layer 60. The reflow process forms the intermetallic compound layer 70 at the interface between the upper surface of the protective metal layer 60 and the lower surface of the solder layer 80. The intermetallic compound layer 70 is formed on only the upper surface of the protective metal layer 60, which contacts the solder layer 80. For example, the Sn in the solder layer 80 reacts with the Ni in the protective metal layer 60 and the Cu diffused from the metal post 55 to form the intermetallic compound layer 70 with the intermetallic compound of $(Cu,Ni)_6Sn_5$. The intermetallic compound layer 70 bonds the protective metal layer 60 and the solder layer 80. In this step, the conditions of the reflow process are set so that the intermetallic compound layer 70 is formed at the interface between the protective metal layer 60 and the solder layer 80. For example, the reflow process is performed at a temperature of approximately 230° C. to 280° C. for approximately 10 to 200 seconds.

The wiring substrate 10 of FIGS. 1 and 2 is manufactured through the steps described above.

The present embodiment has the advantages described below.

(1) The terminal structure includes the intermetallic compound layer 70 that covers only the upper surface of the protective metal layer 60. Thus, the intermetallic compound layer 70 is not arranged on the side surface of the protective metal layer 60. The intermetallic compound layer 70 increases the bonding strength of the protective metal layer 60 and the solder layer 80 and restricts overflow of the solder layer 80. Thus, the intermetallic compound layer 70, which is arranged on only the upper surface of the protective metal layer 60, restricts overflow of the solder layer 80 to the side surface of the protective metal layer 60. The intermetallic compound layer 70 is also arranged on the upper surface of the projection 63 of the protective metal layer 60 that projects further outward from the side surface of the wiring layer 52. That is, the intermetallic compound layer 70 is arranged on the upper surface of the outer circumferential edge of the protective metal layer 60. This restricts the overflow of the solder layer 80 to the side surface of the protective metal layer 60. Thus, the solder layer 80 will not extend downward beyond the side surface of the protective metal layer 60 toward the wiring layer 52. This avoids spreading of the solder layer 80 in the planar direction from the side surface of the wiring layer 52. As a result, short-circuiting between adjacent parts of the solder layer 80 will be limited even if the pitch is narrowed between the connection terminals 50.

(2) The intermetallic compound layer 70, which is arranged on only the upper surface of the protective metal layer 60, keeps the solder layer 80 on the protective metal layer 60. This allows the diameter of the solder layer 80 and the height of the solder layer 80 to be controlled in a preferred manner.

(3) The protective metal layer 60 is formed on the wiring layer 52, and the projection 63 is arranged on the protective metal layer 60 projecting further outward from the side surface of the wiring layer 52. This forms a step with the side surface of the protective metal layer 60, the lower surface of the projection 63, and the side surface of the wiring layer 52. Thus, the solder layer 80, which is arranged on the upper surface of the protective metal layer 60, will not contact the side surface of the wiring layer 52 and will not wet and spread to the side surface of the wiring layer 52.

(4) The projection 63 extends downward from the side surface of the wiring layer 52 toward the projection end of the projection 63. The projection end of the projection 63 is separated from and faces the side surface of the wiring layer 52 in the planar direction that is orthogonal to the thickness-wise direction of the wiring layer 52. This forms a gap between the projection end of the projection 63 and the side surface of the wiring layer 52. The gap is filled with the underfill resin 95 to produce an anchor effect that increases the adhesion between the underfill resin 95 and the protective metal layer 60.

(5) The upper surface of the wiring layer 52 is formed as an undulated surface including the protruded portions 56 and the recessed portions 57 that are arranged alternately and repetitively. Each of the protruded portions 56 is protruded toward the protective metal layer 60 with an arcuate cross section, and each of the recessed portion 57 is recessed toward the wiring layer 31 with an arcuate cross section. The protective metal layer 60 and the intermetallic compound layer 70 are shaped in conformance with the undulation of the wiring layer 52. In this structure, the interface between the wiring layer 52 and the protective metal layer 60 is undulated. Thus, for example, when mounting the semiconductor element 91 on the wiring substrate 10, even if a large stress acts on the interface between the wiring layer 52 and the protective metal layer 60, the undulation will disperse the stress. This avoids the formation of cracks in the interface between the wiring layer 52 and the protective metal layer 60 that would be caused by a large stress acting on the interface between the wiring layer 52 and the protective metal layer 60. Accordingly, separation of the protective metal layer 60 from the wiring layer 52 is limited. As a result, the connection reliability is improved between the protective metal layer 60 and the wiring layer 52.

Other Embodiments

The above embodiment may be modified as described below. The above embodiment and the modified examples described below may be combined as long as there is no technical contradiction.

The terminal structure of the above embodiment is not limited to the structure illustrated in FIG. 2.

Figure 13:
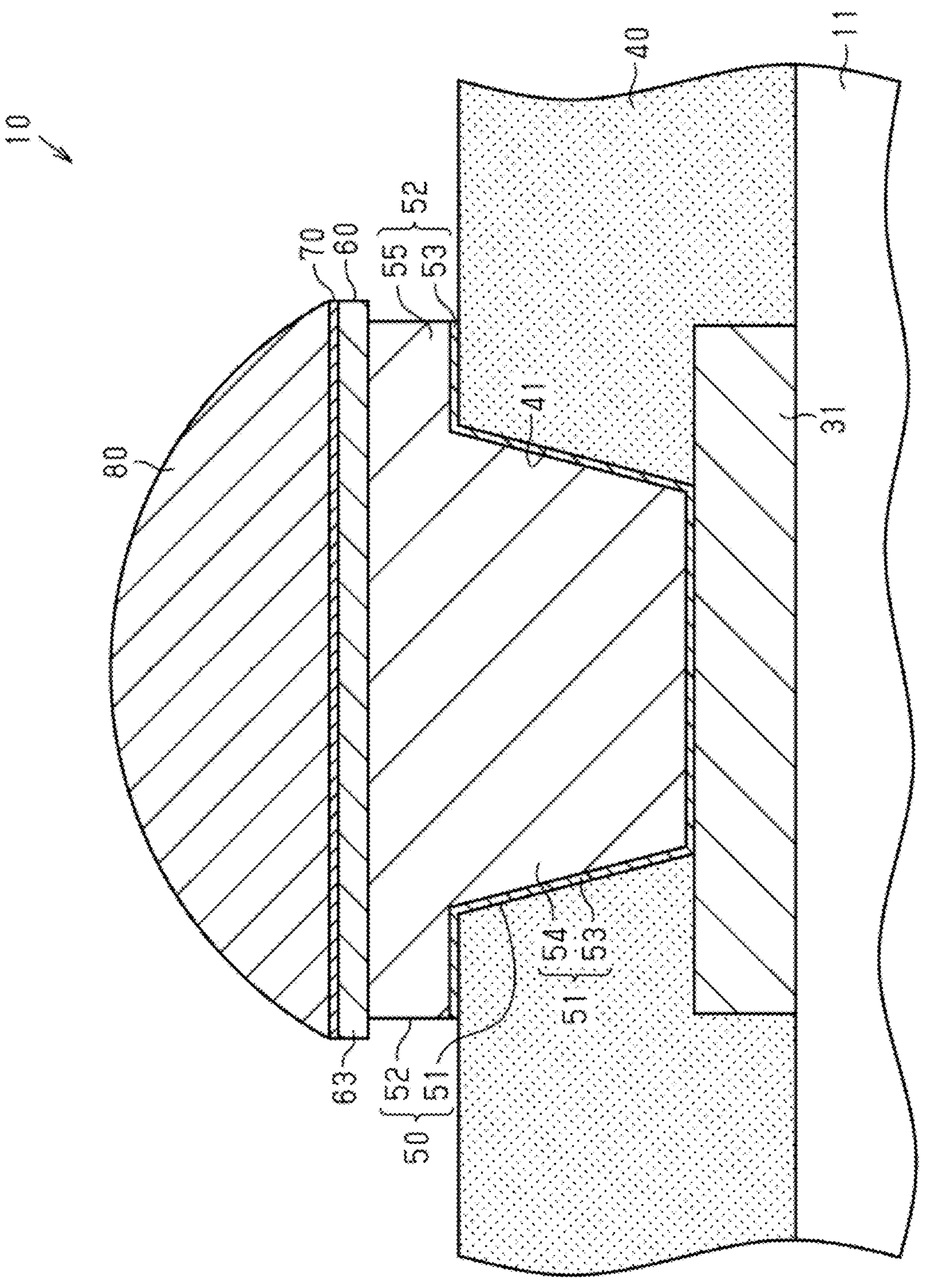
FIG. 13 is a schematic cross-sectional view illustrating a modified example of the wiring substrate.

For example, as illustrated in FIG. 13, the upper surface of the wiring layer 52 may be flat. In this case, the upper surface of the wiring layer 52 extends parallel to, for example, the upper surface of the insulation layer 40.

As illustrated in FIG. 13, for example, the upper surface of the protective metal layer 60 may be flat. In this case, the upper surface of the protective metal layer 60 is parallel to, for example, the upper surface of the insulation layer 40.

As illustrated in FIG. 13, for example, the upper surface of the intermetallic compound layer 70 may be flat. In this case, the upper surface of the intermetallic compound layer 70 is parallel to, for example, the upper surface of the insulation layer 40.

As illustrated in FIG. 13, for example, the projection 63 of the protective metal layer 60 may extend horizontally in the planar direction (lateral direction in drawing).

As illustrated in FIG. 13, for example, the side surface of the metal post 55 may be flat. In this case, the side surface of the metal post 55 extends orthogonal to, for example, the upper surface of the insulation layer 40.

The structure of the connection terminal 50 is not particularly limited.

Figure 14:
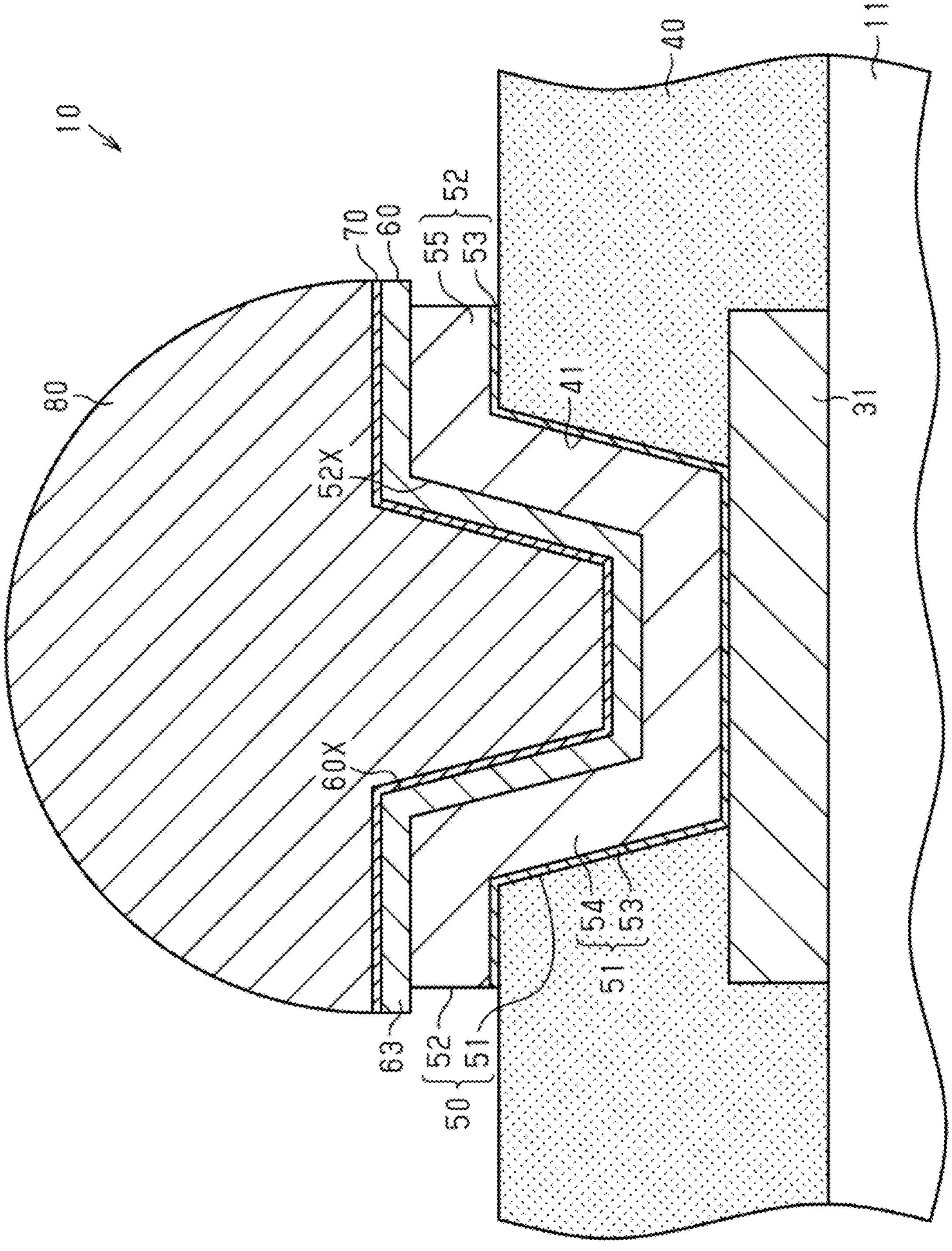
FIG. 14 is a schematic cross-sectional view illustrating another modified example of the wiring substrate.

For example, as illustrated in FIG. 14, the via wiring 51 may be shaped in conformance with the wall surface of each opening 41. In the present modified example, the opening 41 is not fully filled with the via wiring 51. Further, the upper surface of the wiring layer 52 may include a recessed portion 52X recessed toward the wiring layer 31. The recessed portion 52X, for example, extends into the opening 41 from the upper surface of the wiring layer 52. In this case, the protective metal layer 60 covers the entire upper surface of the wiring layer 52 and the entire wall surface of the recessed portion 52X, while exposing the entire side surface of the wiring layer 52. In the present modified example, the upper surface of the protective metal layer 60 includes a recessed portion 60X recessed toward the wiring layer 31. The recessed portion 60X, for example, extends into the opening 41 from the upper surface of the protective metal layer 60. The protective metal layer 60 of the present modified example also includes the projection 63 projecting further outward from the side surface of the wiring layer 52. In the present modified example, the intermetallic compound layer 70 covers the entire upper surface of the protective metal layer 60 and the entire wall surface of the recessed portion 60X, while exposing the entire side surface of the protective metal layer 60 and the entire side surface of the wiring layer 52. In the present modified example, the solder layer 80 covers the entire upper surface of the protective metal layer 60 and extends into the recessed portion 60X of the protective metal layer 60. In the present modified example, the solder layer 80 exposes the entire side surface of the intermetallic compound layer 70, the entire side surface of the protective metal layer 60, and the entire side surface of the wiring layer 52.

In this structure, the formation of the recessed portion 52X in the upper surface of the wiring layer 52 results in the formation of the recessed portion 60X in the upper surface of the protective metal layer 60. Further, the recessed portion 60X is filled with the solder layer 80. This increases the volume of the solder layer 80. This allows the solder layer 80 to be bonded to the connection terminals 50 in a preferred manner even when the connection terminals 50 are miniaturized. Further, the solder layer 80 has a tendency to concentrate at the center of each connection terminal 50. This avoids the formation of voids in the solder layer 80.

In the present modified example, the recessed portion 52X is one example of a second recessed portion, and the recessed portion 60X is one example of a third recessed portion.

In the above embodiment, the seed layer 53 does not have to be formed through an electroless plating process (e.g., electroless copper plating process). For example, the seed layer 53 may be formed through a sputtering process or a vapor deposition process.

In the above embodiment, the seed layer 53 has a single-layer structure. Instead, the seed layer 53 may have a multi-layer structure (e.g., double-layer structure). A seed layer 53 having a double-layer structure may be, for example, formed by sequentially stacking a titanium (Ti) layer and a Cu layer.

In the above embodiment, the solder layer 80 does not have to be formed through an electrolytic solder plating process. For example, solder balls may be mounted on the protective metal layer 60 that is exposed at the bottom of the resist layer 100 in the opening pattern 101, and the solder balls may be melted to form the solder layer 80.

In the above embodiment, the surface-processed layer 23 may be omitted from the wiring substrate 10.

In the above embodiment, the underfill resin 95 may be omitted from the semiconductor device 90.

In the above embodiment, the external connection terminals 96 may be omitted from the semiconductor device 90.

In the above embodiment, instead of the semiconductor element 91, an electric component other than the semiconductor element 91, for example, a crystal oscillator or a chip component, such as a chip capacitor, a chip resistor, or a chip inductor, may be mounted on the wiring substrate 10.

The wiring substrate 10 of the above embodiment may be used in any type of package such as a chip size package (CSP) or a small outline non-lead package (SON).

Clauses

This disclosure further encompasses the following embodiments.

1. A method for manufacturing a terminal structure, the method including:
   - forming an insulation layer that covers a first wiring layer and includes an opening partially exposing an upper surface of the first wiring layer;
   - forming a seed layer that continuously covers an upper surface of the insulation layer and a wall surface of the opening;
   - forming a resist layer on an upper surface of the seed layer, in which the resist layer includes an opening pattern;
   - performing an electrolytic plating process using the resist layer as a mask and the seed layer as a power feeding layer to form via wiring inside the opening and form a second wiring layer on the via wiring and the seed layer exposed by the opening pattern;
   - performing an electrolytic plating process using the resist layer as a mask and the seed layer as a power feeding layer to form a protective metal layer that covers only an upper surface of the second wiring layer;
   - forming a solder layer on only an upper surface of the protective metal layer;
   - removing the resist layer;
   - etching a side surface of the second wiring layer using the protective metal layer as a mask to reduce the second wiring layer in lateral size so that a projection projecting further outward from a side surface of the second wiring layer subsequent to the etching is formed in the protective metal layer; and
   - performing a reflow process to form an intermetallic compound layer at an interface between the upper surface of the protective metal layer and a lower surface of the solder layer to bond the protective metal layer and the solder layer with the intermetallic compound layer.

2. The method according to clause 1, in which the forming a second wiring layer includes forming the upper surface of the second wiring layer as an undulated surface including protruded portions and recessed portions that are arranged alternately and repetitively.

3. The method according to clause 2, in which the projection extends downward from a side surface of the second wiring layer subsequent to the etching toward a projection end of the projection.

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

What is claimed is:

1. A terminal structure, comprising:

a first wiring layer;

an insulation layer covering the first wiring layer;

an opening extending through the insulation layer in a thickness-wise direction and partially exposing an upper surface of the first wiring layer;

via wiring formed in the opening;

a second wiring layer electrically connected to the via wiring and formed on an upper surface of the insulation layer;

a protective metal layer formed on an upper surface of the second wiring layer;

a solder layer formed on an upper surface of the protective metal layer; and an intermetallic compound layer formed at an interface between the protective metal layer and the solder layer, wherein the protective metal layer includes a projection projecting further outward from a side surface of the second wiring layer, the projection extends downward from the side surface of the second wiring layer toward a projection end of the projection, the projection end of the projection is separated from and faces the side surface of the second wiring layer in a planar direction that is orthogonal to the thickness-wise direction of the second wiring layer, the intermetallic compound layer covers only the upper surface of the protective metal layer and exposes a side surface of the protective metal layer and the side surface of the second wiring layer, the solder layer covers only an upper surface of the intermetallic compound layer and exposes a side surface of the intermetallic compound layer, the side surface of the protective metal layer, and the side surface of the second wiring layer, the upper surface of the second wiring layer is an undulated surface including first protruded portions and first recessed portions that are arranged alternately and repetitively, with each of the first protruded portions protruded toward the protective metal layer with an arcuate cross section, and each of the first recessed portions recessed toward the first wiring layer with an arcuate cross section, the protective metal layer is shaped in conformance with the undulated surface, and the intermetallic compound layer is shaped in conformance with the undulated surface.

2. The terminal structure according to claim 1, wherein the side surface of the second wiring layer is curved and recessed into the second wiring layer with an arcuate cross section.

3. The terminal structure according to claim 1, wherein the opening is filled with the via wiring, and the second wiring layer has the form of a post extending upward from the upper surface of the insulation layer.

4. The terminal structure according to claim 1, wherein the via wiring is shaped in conformance with a wall surface of the opening, the upper surface of the second wiring layer includes a second recessed portion recessed toward the first wiring layer, the upper surface of the protective metal layer includes a third recessed portion recessed toward the first wiring layer, and the third recessed portion is filled with the solder layer.

5. The terminal structure according to claim 1, wherein the intermetallic compound layer is formed through reaction between a metal of the protective metal layer and a metal of the solder layer.

6. The terminal structure according to claim 1, wherein the second wiring layer includes Cu, the protective metal layer includes Ni, the solder layer includes Sn, and the intermetallic compound layer Cu, Ni, and Sn.

7. A wiring substrate, comprising: the terminal structure according to claim 1.

8. A terminal structure, comprising:

a first wiring layer;

an insulation layer covering the first wiring layer;

an opening extending through the insulation layer in a thickness-wise direction and partially exposing an upper surface of the first wiring layer;

via wiring formed in the opening;

a second wiring layer electrically connected to the via wiring and formed on an upper surface of the insulation layer;

a protective metal layer formed on an upper surface of the second wiring layer;

a solder layer formed on an upper surface of the protective metal layer; and an intermetallic compound layer formed at an interface between the protective metal layer and the solder layer, wherein the protective metal layer includes a projection projecting further outward from a side surface of the second wiring layer, the intermetallic compound layer covers only the upper surface of the protective metal layer and exposes a side surface of the protective metal layer and the side surface of the second wiring layer, the solder layer covers only an upper surface of the intermetallic compound layer and exposes a side surface of the intermetallic compound layer, the side surface of the protective metal layer, and the side surface of the second wiring layer, the upper surface of the second wiring layer is an undulated surface including first protruded portions and first recessed portions that are arranged alternately and repetitively, with each of the first protruded portions protruded toward the protective metal layer with an arcuate cross section, and each of the first recessed portions recessed toward the first wiring layer with an arcuate cross section, the protective metal layer is shaped in conformance with the undulated surface, and the intermetallic compound layer is shaped in conformance with the undulated surface.

9. The terminal structure according to claim 8, wherein the side surface of the second wiring layer is curved and recessed into the second wiring layer with an arcuate cross section.

10. The terminal structure according to claim 8, wherein the opening is filled with the via wiring, and the second wiring layer has the form of a post extending upward from the upper surface of the insulation layer.

11. The terminal structure according to claim 8, wherein the via wiring is shaped in conformance with a wall surface of the opening, the upper surface of the second wiring layer includes a second recessed portion recessed toward the first wiring layer, the upper surface of the protective metal layer includes a third recessed portion recessed toward the first wiring layer, and the third recessed portion is filled with the solder layer.

12. The terminal structure according to claim 8, wherein the intermetallic compound layer is formed through reaction between a metal of the protective metal layer and a metal of the solder layer.

13. The terminal structure according to claim 8, wherein the second wiring layer includes Cu, the protective metal layer includes Ni, the solder layer includes Sn, and the intermetallic compound layer Cu, Ni, and Sn.

14. A wiring substrate, comprising: the terminal structure according to claim 8.

* * * * *